(12) United States Patent
Ahn et al.

(10) Patent No.: US 11,280,817 B2
(45) Date of Patent: Mar. 22, 2022

(54) VIRTUALIZATION STRUCTURE FOR POWER/POWER AMOUNT METERING AND POWER QUALITY ANALYZING APPARATUS, AND METHOD FOR ACQUIRING, TRANSMITTING AND PROCESSING METER DATA USING SAME

(71) Applicant: Starkoff Co., Ltd., Seoul (KR)

(72) Inventors: Tae Hyo Ahn, Seoul (KR); Hyun Kwon Ahn, Seoul (KR); Han Soo Kim, Seoul (KR)

(73) Assignee: Starkoff Co., Ltd., Seoul (KR)

( * ) Notice: Subject to any disclaimer, the term of this patent is extended or adjusted under 35 U.S.C. 154(b) by 120 days.

(21) Appl. No.: 16/651,629

(22) PCT Filed: Sep. 27, 2018

(86) PCT No.: PCT/KR2018/011466
§ 371 (c)(1),
(2) Date: Mar. 27, 2020

(87) PCT Pub. No.: WO2019/066513
PCT Pub. Date: Apr. 4, 2019

(65) Prior Publication Data
US 2020/0309828 A1    Oct. 1, 2020

(30) Foreign Application Priority Data

Sep. 28, 2017   (KR) ........................ 10-2017-0126337

(51) Int. Cl.
*G01R 22/06*    (2006.01)
*H04L 67/12*    (2022.01)
*H04Q 9/00*    (2006.01)

(52) U.S. Cl.
CPC ............ *G01R 22/063* (2013.01); *H04L 67/12* (2013.01); *H04Q 9/00* (2013.01); *H04Q 2209/60* (2013.01)

(58) Field of Classification Search
CPC ........ G01R 22/063; H04L 67/12; H04Q 9/00; H04Q 2209/60
See application file for complete search history.

(56) References Cited

U.S. PATENT DOCUMENTS

2014/0365026 A1* 12/2014 Komano ............... H04L 9/0891
                                                                                                           700/297
2017/0063566 A1    3/2017 Seminario et al.
2018/0359542 A1* 12/2018 Jang ..................... G01R 21/133

FOREIGN PATENT DOCUMENTS

KR      2013-0023634 A    3/2013
KR          1631094 B1    6/2016
(Continued)

OTHER PUBLICATIONS

Extended European Search Report issued in EP Patent Application No. 18862742.6 dated Mar. 3, 2021.
(Continued)

*Primary Examiner* — Manuel A Rivera Vargas
(74) *Attorney, Agent, or Firm* — Kaplan Breyer Schwarz, LLP

(57) ABSTRACT

The present invention relates to a virtualization structure for a power/power amount and power quality analyzing apparatus, and a method for acquiring, transmitting and processing meter data using same, whereby an IoT sensor, provided to each inlet line of each distribution board of a facility, transmits, via at least one gateway installed on a network, power data corresponding to power consumed by electrical devices electrically connected to each of the distribution boards, and the power data acquired from each of the IoT sensors are analyzed, and thus electrical physical quantities, (Continued)

such as power/the power amount consumed in the facility and/or power quality, are remotely analyzed and provided.

42 Claims, 10 Drawing Sheets

(56) References Cited

FOREIGN PATENT DOCUMENTS

| KR | 2016-0118813 A | 10/2016 |
|----|----------------|---------|
| KR | 2017-0035696 A | 3/2017  |
| KR | 2017-0099003 A | 8/2017  |

OTHER PUBLICATIONS

International Search Report issued in counterpart PCT application No. PCT/KR2018/011466, dated Jan. 17, 2019, 4 pp.

\* cited by examiner

FIG. 1
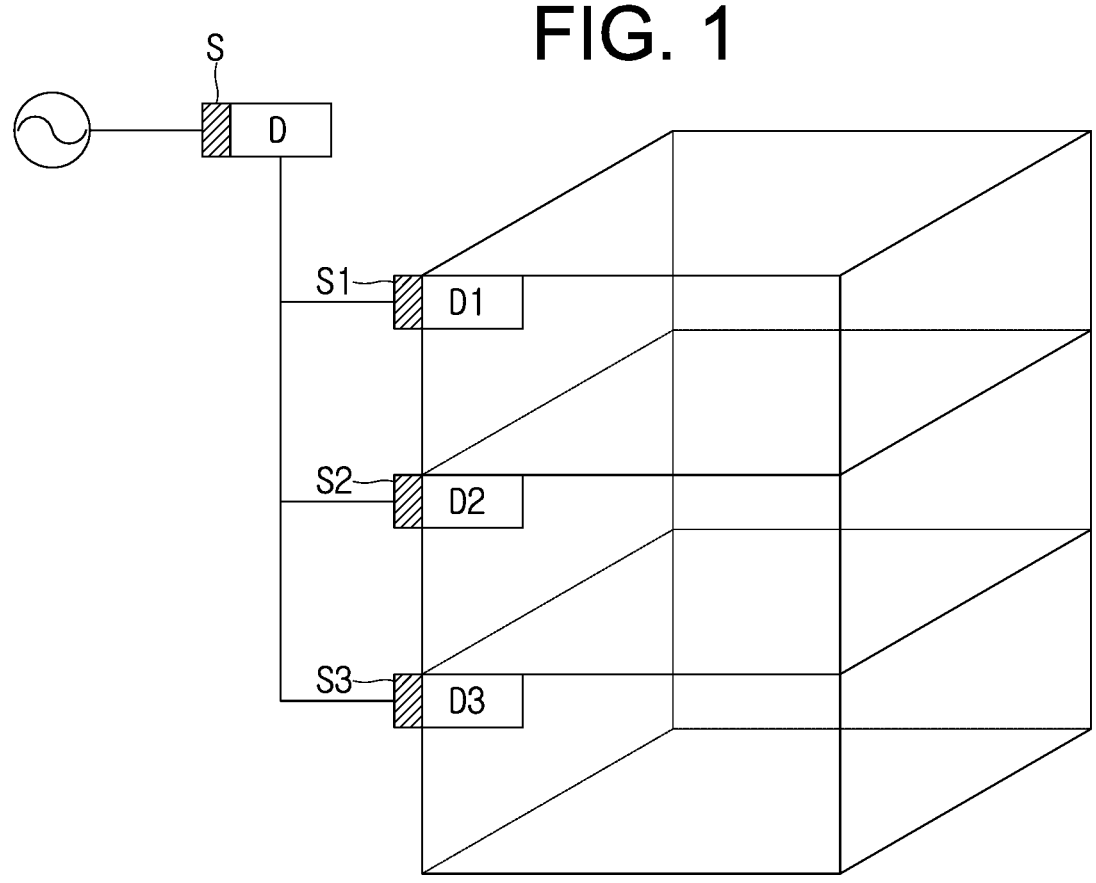
(A)
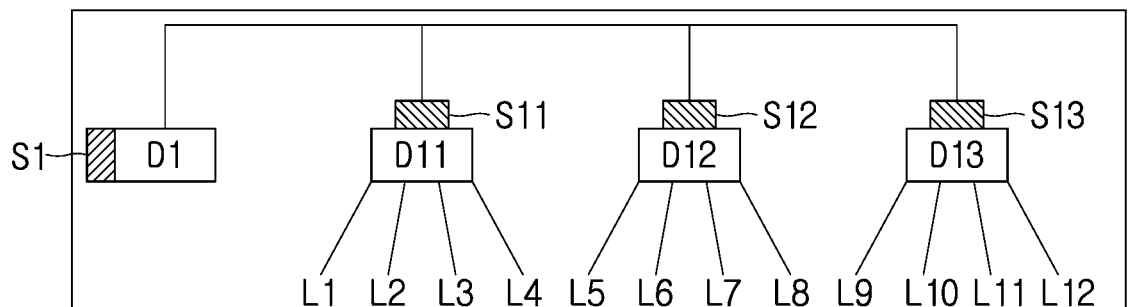
(B)

FIG. 3
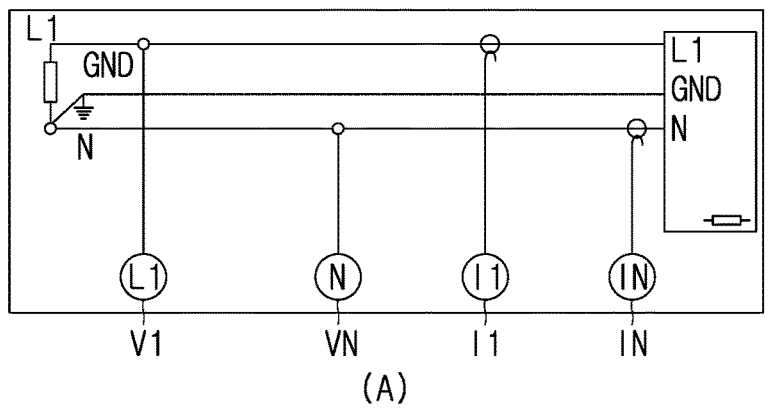
(A)
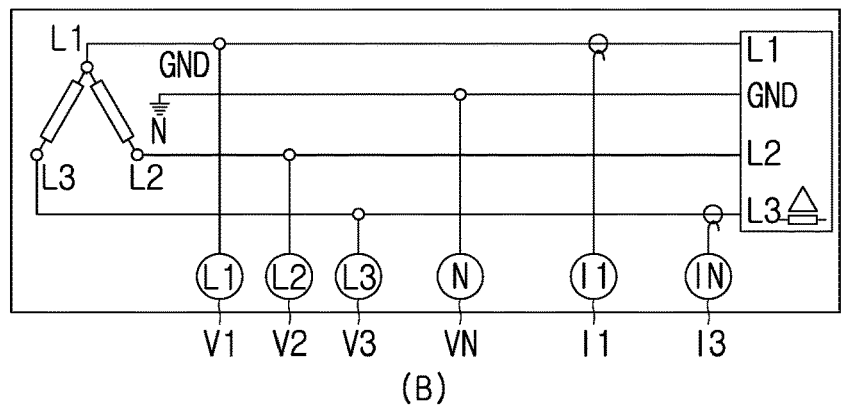
(B)
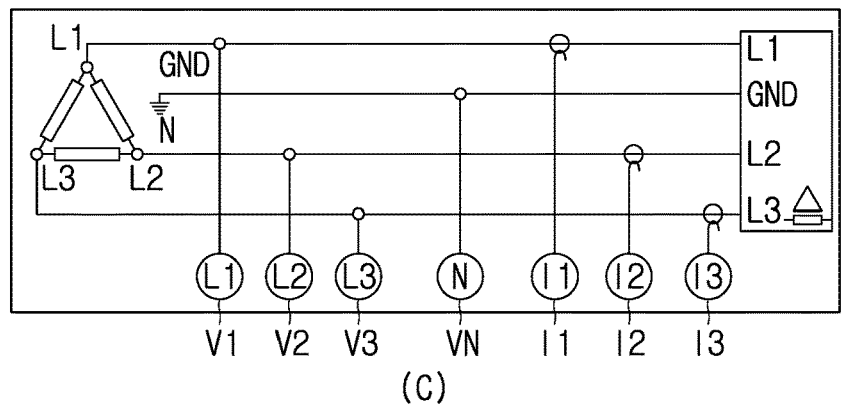
(C)
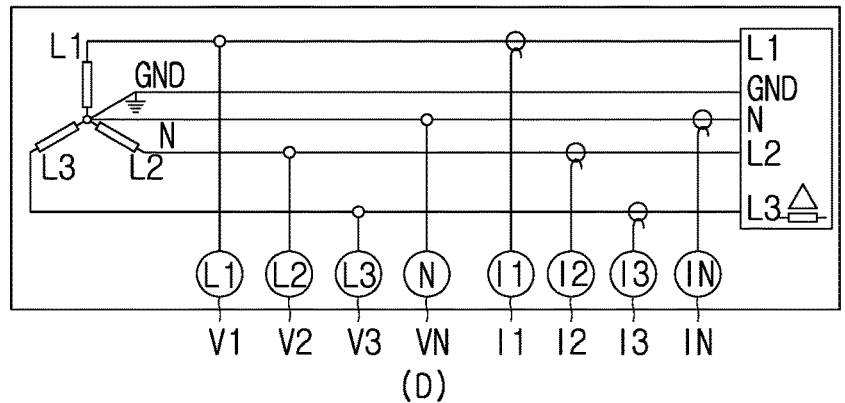
(D)

| TRANSMISSION NET-INCREASING COUNTING VARIABLE (NNNN) | NUMBER OF MEASUREMENT VALUES (M) | MEASUREMENT VALUE 1 | MEASUREMENT VALUE 2 | . . . | MEASUREMENT VALUE M |
|---|---|---|---|---|---|

(B)

| LONG-PERIOD PARAMETER (NNNN) | NUMBER OF MEASUREMENT VALUES (M) | MEASUREMENT VALUE 1 | MEASUREMENT VALUE 2 | . . . | MEASUREMENT VALUE M |
|---|---|---|---|---|---|

| TRANSMISSION NET-INCREASING COUNTING VARIABLE (NNNN) | NUMBER OF MEASUREMENT VALUES (M+4) | AVERAGE OF MEASUREMENT VALUES | STANDARD DEVIATION OF MEASUREMENT VALUES | STARTING POINTS OF EVENTS | EVENT CODES OR EVENT SHAPES | EVENT SHAPE DATA #1 | ... | EVENT SHAPE DATA #M |

(B)

| TRANSMISSION NET-INCREASING COUNTING VARIABLE (NNNN) | PACKET SIZE | CHKSUM | COMPRESSED MEASUREMENT VALUE(S) | ns # VIRTUALIZATION STRUCTURE FOR POWER/POWER AMOUNT METERING AND POWER QUALITY ANALYZING APPARATUS, AND METHOD FOR ACQUIRING, TRANSMITTING AND PROCESSING METER DATA USING SAME

FIELD OF THE DISCLOSURE

The present disclosure relates to a virtualization structure of a power/energy & electricity quality analyzing device and a method for acquiring, transmitting and processing meter data using the same; and more particularly, to the virtualization structure of the power/energy & electricity quality analyzing device which remotely analyzes and provides electrical physical quantities such as power/energy and/or power quality consumed in at least one facility by performing a process of analyzing the power data acquired from each of IoT sensors via at least one gateway over a network if each of the IoT sensors installed in each of inlet lines in each of distribution boards of the facility transmits power data corresponding to power consumed by electric devices electrically connected with each of the distribution boards, and the method for acquiring, transmitting and processing the meter data using the same.

BACKGROUND OF THE DISCLOSURE

Until now, the electric power measurement & electricity quality analysis measurement device functions such that a user uses the measuring device to measure the current I(t) flowing on each phase and the voltage V(t) between phases of the power line, then the measuring device numerically processes and displays the data required for a meter result.

That is, the conventional general metering device calculates the electrical energy with a calculating device such as a power processor using values of a current/voltage sensor, post-processes and transmits the electrical energy via data bus inside the metering device, to thereby allow the electrical energy to be displayed on a screen of the metering device.

However, such a metering device is used to analyze a problem in an electrical circuit or to monitor the quality of supplied electricity by measuring a current, a voltage, or a phase flowing in the electrical circuit by connecting to a distribution board or an instrument if necessary.

Therefore, the conventional metering device has, as well as the inconveniences of having to install a metering device that connects with a plurality of power lines by mobilizing an electrician on-site as needed and having to download and analyze the necessary data from the storage device of the measurement device, the economic problem that requires the constant operation of expensive equipment for time series analysis spanning over a long time period.

In addition, in some industrial sites, these metering devices are connected to a communication network to configure a system for monitoring the electricity supply status and operation status of the industrial sites from a remote control room. However, in addition to having a problem of high investment costs because an expensive measurement device must be installed on required devices or equipment separately on the industrial sites and must be run 24 hours a day, there is a problem that it cannot be applied to a factory facility in operation because it cannot be installed during plant operation. In addition, the procedure to register the on-site measurement device in the network for each site is essential for the installation. If it is installed per distribution board, it is impossible to analyze the operation status of the electric devices of each unit of the distribution board. Also, to monitor each of the electric devices, expensive monitoring equipment must be installed for each of the electric devices, and its maintenance becomes infeasible.

SUMMARY OF THE DISCLOSURE

It is an object of the present disclosure to solve all the aforementioned problems.

It is another object of the present disclosure to meter power consumed in a facility without separate expensive equipment.

It is still another object of the present disclosure to provide a power metering system that can be installed and operated without regard to environment of the facility with ease.

It is still yet another object of the present disclosure to monitor each of operation states of each of one or more electric devices electrically connected with each of distribution boards, without extra equipment.

In order to accomplish objects above, representative structures of the present disclosure are described as follows.

In accordance with one aspect of the present disclosure, there is provided a method for metering at least one electrical physical quantity by using an Internet of Things (IoT), including steps of: (a) if each of IoT sensors installed in each of inlet lines in each of distribution boards of at least one facility transmits power data corresponding to power consumed by one or more electric devices electrically connected with each of the distribution boards, a metering server performing a process of acquiring the power data transmitted from each of the IoT sensors via at least one gateway over a network; and (b) the metering server performing a process of analyzing the power data acquired from each of the IoT sensors, to thereby meter the electrical physical quantity corresponding to total power consumed in the facility.

In accordance with another aspect of the present invention, there is provided a metering server for metering at least one electrical physical quantity by using an Internet of Things (IoT), including: (a) a metering server performing a process of acquiring power pattern in time series corresponding to power consumed by one or more electric devices electrically connected with each of the distribution boards from each of inlet lines of the distribution boards in the facility; and (b) the metering server performing a process of analyzing the power pattern in time series, to thereby monitor the power for each of usages and for each of the electric devices.

In accordance with still another aspect of the present invention, there is provided a method for metering at least one electrical physical quantity by using power data on each of distribution boards in at least one facility, including steps of: a communication part, if each of IoT sensors installed in each of inlet lines in each of distribution boards of at least one facility transmits power data corresponding to power consumed by one or more electric devices electrically connected with each of the distribution boards, for acquiring the power data transmitted from each of the IoT sensors via at least one gateway over a network; and a processor for performing a process of analyzing the power data acquired from each of the IoT sensors, to thereby meter the electrical physical quantity corresponding to total power consumed in the facility.

In accordance with still yet another aspect of the present invention, there is provided a metering server for metering at least one electrical physical quantity by using power data on each of distribution boards in at least one facility, including: a communication part for acquiring power pattern in time series corresponding to power consumed by one or more electric devices electrically connected with each of the distribution boards from each of inlet lines of the distribution boards in the facility; and a processor for performing a process of analyzing the power pattern in time series, to thereby monitor the power for each of usages and for each of the electric devices.

In addition, recordable media that are readable by a computer for storing a computer program to execute the method of the present disclosure is further provided.

BRIEF DESCRIPTION OF THE DRAWINGS

The above and other objects and features of the present disclosure will become apparent from the following description of preferred embodiments given in conjunction with the accompanying drawings, in which:

FIG. 1 is a drawing schematically illustrating a facility where a virtual metering system is applied in accordance with one example embodiment of the present disclosure.

FIG. 3 is a drawing schematically illustrating installation statuses of one or more IoT sensors in the virtual metering system in accordance with one example embodiment of the present disclosure.

FIG. 4 is a drawing schematically illustrating one example of data packets to be used for synchronizing power data in the virtual metering system in accordance with one example embodiment of the present disclosure.

FIG. 7 is a drawing schematically illustrating the power data compressed for transmission in the virtual metering system in accordance with one example embodiment of the present disclosure.

DETAILED DESCRIPTION OF THE PREFERRED EMBODIMENTS

Figure 2:
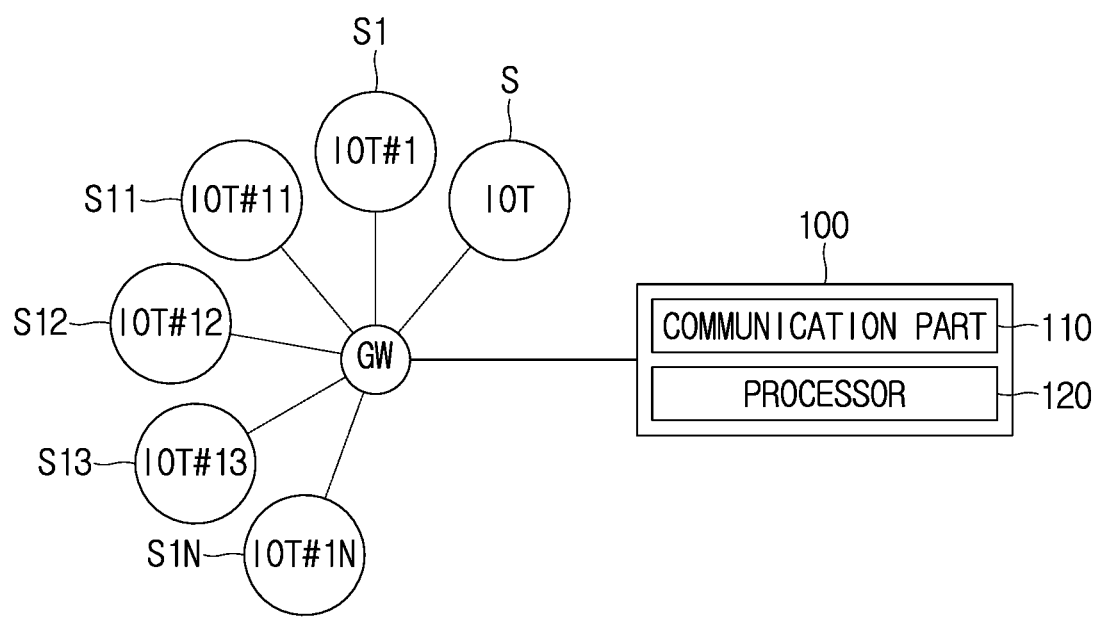
FIG. 2 is a drawing schematically illustrating the virtual metering system in accordance with one example embodiment of the present disclosure.

In the following detailed description, reference is made to the accompanying drawings that show, by way of illustration, specific embodiments in which the disclosure may be practiced. These embodiments are described in sufficient detail to enable those skilled in the art to practice the disclosure. It should be noted that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it should be noted that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to the present disclosure to be carried out easily, the example embodiments of the present disclosure by referring to attached diagrams will be explained in detail as shown below.

FIG. 1 is a drawing schematically illustrating a facility where a virtual metering system is applied in accordance with one example embodiment of the present disclosure.

By referring to (a) of FIG. 1, at least one main distribution board D into which an external power is inlet may be installed at the facility such as a house, apartment, building, plant, etc. One or more loads, which are one or more electric devices, may be electrically connected with the main distribution board D, or one or more sub-distribution boards D1, D2, and D3 may be electrically connected with the main distribution board D. Also, by referring to (b) of FIG. 1, one or more of the loads, i.e., the electric devices, may be electrically connected with each of the sub-distribution boards D1, D2, and D3, or one or more terminal distribution boards D11, D12, and D13 may be electrically connected with each of the sub-distribution boards. As a result, each of the distribution boards in the facility may be electrically connected with one another in a hierarchy, and each of the electric devices L1, L2, L3, . . . , and L12 may be electrically connected with the terminal distribution boards D11, D12, and D13, to thereby allow implementation of an electric circuit for driving the loads in the facility. Herein, the structure of the distribution boards and the electric devices is simplified in FIG. 1, however, this is for convenience of explanation only, and electric circuits with more complex structures may be implemented with the distribution boards in the actual facility. Especially, FIG. 1 shows circuit configuration of the main distribution board D, the sub-distribution boards D1, D2, and D3, and the terminal distribution boards D11, D12, and D13, however, circuit configuration of the sub-distribution boards in multiple levels of the hierarchy may be implemented between the main distribution board and the terminal distribution boards.

And, each of IoT sensor groups S, S1, S2, S3, S11, S12, and S13 of the IoT sensors for detecting power consumption data may be installed on each of the inlet lines of each of the distribution boards D, D1, D2, D3, D11, D12, and D13 in FIG. 1. Herein, the power consumption data may correspond to the power consumed by the electric devices electrically connected with each of the distribution boards. That is, each of the IoT sensor groups S, S1, S2, S3, S11, S12, and S13 may be installed on each of the inlet lines of each of the distribution boards D, D1, D2, D3, D11, D12, and D13, may detect instantaneous current and instantaneous voltage of the power supplied via each of the distribution boards, and may acquire power consumption information for metering the power consumption by using the instantaneous current and the instantaneous voltage detected per each predetermined sampling period. Herein, each of the IoT sensor groups S, S1, S2, S3, S11, S12, and S13 may include one or more IoT sensors which acquire the power consumption information corresponding to the instantaneous current and the instantaneous voltage on the inlet lines. That is, the IoT sensors are installed by the number appropriate to wiring types of the inlet lines, and the power information on the inlet lines may be metered by the IoT sensor groups installed on the inlet lines.

Next, by referring to FIG. 2, each of the IoT sensor groups S, S1, S11, S12, S13, and S1$n$ may be connected with a gateway gw over a network, and the gateway gw may be connected with a metering server 100 over the network.

Herein, the gateway gw may be installed by multiple numbers in the facility, and each of the gateways gw may be connected with the IoT sensors located in predetermined areas.

Also, each of the IoT sensor groups S, S1, S11, S12, and S13 may be connected with the gateway gw via wireless communication. Herein, the wireless communication may be in a mesh topology. That is, each of the IoT sensors included in the IoT sensor groups may be connected with the gateway gw over a mesh network.

And, the metering server 100 may include a communication part 110 and a processor 120. The communication part 110 may acquire the power data transmitted from each of the IoT sensors via at least one gateway over the network. The processor 120 may synchronize and analyze the power data acquired via the communication part 110, to thereby meter at least one of electric physical quantities, e.g., the power, electric energy, electricity quality, etc., corresponding to the power consumed in the facility, and may analyze power pattern in time series corresponding to the power data, to thereby monitor the power consumed in the facility separately for each of usages and for each of the electric devices.

As a result, in one example embodiment of the present disclosure, elementary electric physical quantities including the instantaneous voltage and the instantaneous current may be measured at each of the distribution boards in the facility. And using the elementary electric physical quantities measured at each of the distribution boards via IoT communication, the metering server may perform a process of metering the electric physical quantities such as the power, the electric energy, the electricity quality, etc. corresponding to the power consumed in the facility, and the virtual metering system may be configured by using the metering server.

A method for acquiring, transmitting, and processing meter data in the virtual metering system configured as such in accordance with one example of the present disclosure is described by referring to FIGS. 3 to 10, as follows.

Each of the IoT sensors installed in each of the inlet lines in each of the distribution boards of the facility may acquire the power consumption information, e.g., the instantaneous voltage and the instantaneous current, corresponding to the power consumed by each of the electric devices electrically connected with each of the distribution boards, and may transmit the power consumption information to the metering server 100 as the power data via the gateway gw.

Herein, the IoT sensors may be installed by the appropriate number on each of the inlet lines of each of the distribution boards according to each of the wiring types of each of the distribution boards. That is, each of the IoT sensors may be installed on each of the inlet lines of each of the distribution boards according to measurement points.

This process is described in detail by referring to FIG. 3, as follows.

First, as can be seen in (a) of FIG. 3, if the wiring type of the distribution board is single-phase three-wire type, at least one IoT sensor including a voltage sensor and a current sensor may be used, since the voltage V1 and the current I1 of the line L, and the voltage VN and the current IN of the line N are required for metering the elementary electric physical quantities.

And, as can be seen in (b) of FIG. 3, if the wiring type of the distribution board is three-phase three-wire two-clamp current type, then at least three IoT sensors including the voltage sensors and the currents sensors may be used, since the voltage V1 of the line L1, the voltage V2 of the line L2, the voltage V3 of the line L3, and the voltage VN of the line N, and the current I1 of the line L1 and the current I3 of the line L3 are required for metering the elementary electric physical quantities.

Also, as can be seen in (c) of FIG. 3, if the wiring type of the distribution board is three-phase three-wire type, at least three IoT sensors including the voltage sensors and the current sensors may be used, since the voltage V1 and the current I1 of the line L1, the voltage V2 and the current I2 of the line L2, the voltage V3 and the current I3 of the line L3, and the voltage VN of the line N are required for metering the elementary electric physical quantities.

And, as can be seen in (d) of FIG. 3, if the wiring type of the distribution board is three-phase four-wire type, at least three IoT sensors including the voltage sensors and the current sensors may be used, since the voltage V1 and the current I1 of the line L1, the voltage V2 and the current I2 of the line L2, the voltage V3 and the current I3 of the line L3, and the voltage VN and the current IN of the line N are required for metering the elementary electric physical quantities.

On condition that one or more IoT sensors are installed as such in each of the distribution boards according to each of the wiring types of each of the distribution boards, each of the IoT sensors may acquire the power consumption information to be used for metering the electric physical quantities such as the power, the electric energy, the electricity quality, etc. for each predetermined sampling period, by using the instantaneous voltage and the instantaneous current detected by the voltage sensor and the current sensor in real-time from each of the inlet lines of each of the distribution boards.

And, each of the IoT sensors may transmit the power consumption information acquired for each predetermined sampling period as the power data to the metering server 100 via the gateway gw for each predetermined transmission period.

Herein, as can be seen in FIG. 4, each of the IoT sensors may transmit the power data in a form of data packets. That is, a measurement value 1, a measurement value 2, . . . , and a measurement value m, which are the power consumption information acquired for each predetermined sampling period, may be transmitted in a form of a single data packet.

Then, the communication part 110 of the metering server 100 may acquire the power data transmitted from each of the IoT sensors, included in each of the IoT sensor groups S, S1, S2, S3, S11, S12, and S13 at each of the measurement points which is each of the inlet lines of each of the distribution boards D, D1, D2, D3, D11, D12, and D13, via at least one gateway gw over the network.

That is, the metering server 100 may perform a process of acquiring the power data from each of the IoT sensors for each predetermined transmission period, where each of the IoT sensors acquires the power consumption information for each predetermined sampling period from each of the inlet lines of each of the distribution boards D, D1, D2, D3, D11, D12, and D13. Herein, the power data may include the power consumption information acquired as corresponding to the predetermined sampling period by each of the IoT sensors during the predetermined transmission period.

And, the processor 120 of the metering server 100 may perform a process of synchronizing the power data acquired from each of the IoT sensors, and a process of analyzing the synchronized power data, to thereby meter the electrical physical quantity corresponding to total power consumed in the facility.

As one example, the metering server 100 may perform (i) a process of identifying a 1-st to an n-th IoT sensors S11 installed on at least one specific inlet line of a specific distribution board D11 by referring to location information on each of the IoT sensors, and (ii) a process of metering the electrical physical quantities, such as the power, the electric energy, the electricity quality, etc., consumed by each of specific electric devices L1, L2, L3, and L4 electrically connected with the specific distribution board by referring to the power data acquired from the 1-st to the n-th IoT sensors S11, where the 1-st to the n-th IoT sensors are among the IoT sensors, the specific inlet line is among the inlet lines, the specific distribution board is among the distribution boards, and the specific electric devices are among the electric devices.

That is, as described by referring to FIG. 3, each of the IoT sensors may include the voltage sensor and the current sensor, and one or more IoT sensors may be installed on each of the distribution boards according to each of the wiring types of each of the distribution boards. Therefore, the IoT sensors installed on each of the inlet lines of each of the distribution boards must be grouped in order to meter the elementary electric physical quantities such as the instantaneous voltage, the instantaneous current, etc. supplied via each of the distribution boards according to each of the wiring types. And the electric physical quantities corresponding to the power supplied via each of the distribution boards may be metered by analyzing the power data of each of the IoT sensor groups S, S1, S2, S3, S11, S12, and S13 in conjunction with one another.

And, synchronization of the power data acquired from each of the IoT sensors must be performed, since the metering server 100 meters the electric physical quantities such as the power, the electric energy, the electricity quality, etc., by using the power consumption information, i.e., elementary quantity information of the electricity including the instantaneous voltage, the instantaneous current, etc., acquired from the IoT sensors. As one example, in the three-phase three-wire wiring type as can be seen in (c) of FIG. 3, the electric physical quantity cannot be accurately measured, unless pieces of the power data acquired from three IoT sensors are synchronized. Also, unless the synchronization is performed among the specific distribution board D and the sub-distribution boards D1, D2, and D3, a reliability of the metering cannot be guaranteed, because the electric physical quantities metered at the specific distribution board D does not coincide with a sum of the electric physical quantities metered at the sub-distribution boards D1, D2, and D3.

Therefore, in order to synchronize the power data, each of the IoT sensors may incorporate synchronization information into the power data when transmitting the power data, and the metering server 100 may synchronize the power data acquired from each of the IoT sensors by referring to the synchronization information.

For this, as shown in FIG. 4, each of the IoT sensors may incorporate the synchronization information such as a transmission net-increasing counting variable, a long-period parameter, etc. into a packet of the power data, and transmit the packet. Also, each of the IoT sensors may transmit the synchronization information as a flag on the data packet.

Herein, each of the IoT sensors may have an RTC (Real Time Clock) embedded therein or may not have the RTC embedded therein, and processes of synchronizing the power data for each case are described. Clearly, an IoT sensor without the RTC may have its own embedded clock for digital processing.

First, in case of the IoT sensor without the RTC, one of (i) a process of synchronizing the power data acquired from at least one specific IoT sensor among the IoT sensors by using the net-increasing counting variable as the synchronization information where the net-increasing counting variable increases whenever the specific IoT sensor transmits the power data, (ii) a process of synchronizing the power data received from the specific IoT sensor by using the long-period parameter as the synchronization information, where the long-period parameter is a periodically-reset counting variable, and (iii) a process of synchronizing the power data received from the specific IoT sensor by using both the net-increasing counting variable and the long-period parameter as the synchronization information, may be performed.

That is, as can be seen in (a) of FIG. 4, by allowing the specific IoT sensor to record the counting variable in the power data, where the counting variable net-increases whenever the power data is transmitted, the metering server 100 may synchronize the power data acquired from the specific IoT sensor by using the net-increasing counting variable. Especially, even if part of the transmitted data is lost due to the network failure, etc., whether the data is lost can be determined by using the net-increasing counting variable, and in addition, the synchronization may be performed by using the data excluding the lost data. Also, as can be seen in (b) of FIG. 4, by allowing the specific IoT sensor to record the periodically reset counting variable in the power data as the long-period parameter, a time range of the long-period parameter may be set as a period which efficiently represents variations in each load corresponding to each of the electric devices. As one example, considering that a characteristic period of an on/off load in a house ranges from tens of msec to tens of seconds, and that a characteristic period of a large motor load in a plant ranges from a few seconds to tens of seconds, a minimal time range may be set as appropriate multiples, a few to ten times, of the characteristic period of the load, and the power data acquired from each of the IoT sensors may be synchronized by using the long-period parameter within the set time range. That is, the long-period parameter is set as the periodically-reset counting variable such that the long-period parameter corresponds to a time range including a period where the variations in each of the loads corresponding to each of the electric devices are reflected. Also, if the net-increasing counting variable and the long-period parameter are used simultaneously, the power data may be synchronized by allowing a counting value of the long-period parameter to be the net-increasing counting variable, that is, a counting variable whose value net-increases whenever the power data is transmitted.

Next, in case of the IoT sensor where the RTC is embedded, one of (i) a process of synchronizing the power data acquired from at least one specific IoT sensor among the IoT sensors by using time range corresponding to a long-period parameter as the synchronization information, where the long-period parameter is a value of an RTC (Real Time Clock) embedded in the specific IoT sensor, and (ii) a process of synchronizing the power data acquired from the specific IoT sensor by using the time range corresponding to the long-period parameter as the synchronization information, where part of values of the RTC embedded in the specific IoT sensor is used as the net-increasing counting variable for the long-period parameter, may be performed.

That is, as can be seen in (b) of FIG. 4, if the long-period parameter is used as the synchronization information, then the time range including a period where the variations in each of the loads corresponding to each of the electric devices are reflected may be set using the time information of the RTC in the IoT sensor.

Also, in case the power data acquired from the IoT sensors without the RTC and the power data from the IoT sensors with the RTC are synchronized, part of output values from the RTC embedded in at least one specific IoT sensor among the IoT sensors may be used as the net-increasing counting variable. That is, absolute time information of the RTC may be converted into relative time information, and the power data are synchronized by using this.

Figure 5:
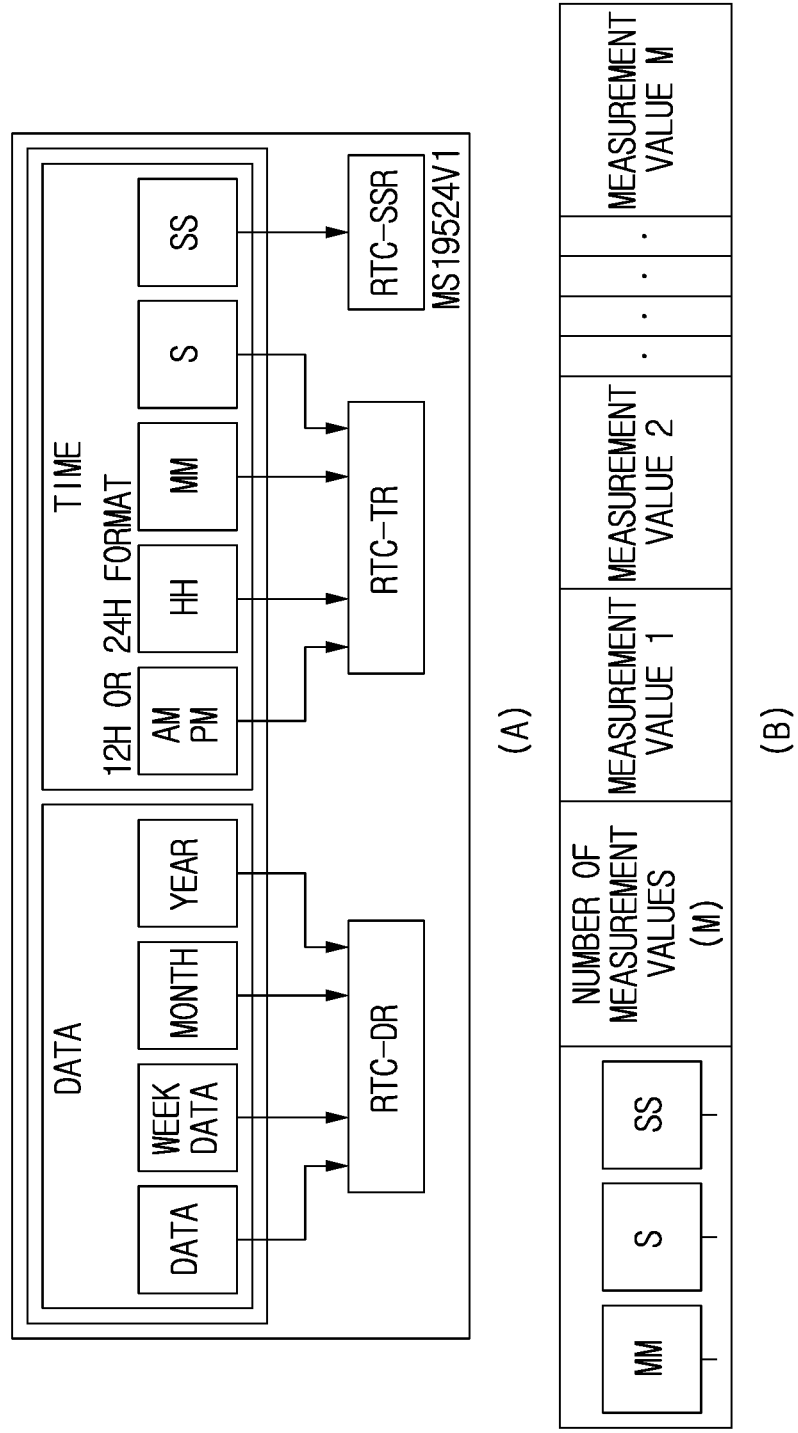
FIG. 5 is a drawing schematically illustrating another example of the data packets to be used for synchronizing the power data in the virtual metering system in accordance with one example embodiment of the present disclosure.

For example, with the absolute time information of the RTC displayed as shown in (a) of FIG. 5, if the long-period is in the order of minutes, by using part of the output values of the RTC, that is, by using seconds information which is the absolute time information smaller than minutes as shown in (b) of FIG. 5, the power data may be synchronized with the absolute time information including minutes, seconds, hundredths of second as the net-increasing counting variable.

In addition to synchronizing the power data acquired from each of the IoT sensors as such, initial synchronization of each of the IoT sensors may also be required.

Therefore, the metering server 100 may synchronize operation of each of the IoT sensors when the IoT sensors are initially installed, separate from synchronizing the power data acquired from each of the IoT sensors by using the synchronization information. That is, if at least one broadcast signal is acquired from the IoT sensors over a mesh network when the IoT sensors are initially installed, the metering server 100 may synchronize initial operation states of the IoT sensors by initializing each starting time of each measurement and the synchronization information, e.g., the long-period counting variable, of each of the IoT sensors.

In the above description, the metering server 100 is described as performing a process of synchronizing the power data transmitted from each of the IoT sensors or the operation of each of the IoT sensors. However, as another example, the gateway gw may perform the process of synchronizing the power data transmitted from each of the IoT sensors or the operation of each of the IoT sensors.

That is, by referring to the synchronization information on the power data transmitted from each of the IoT sensors, the gateway may synchronize and transmit the power data acquired from each of the IoT sensors to the metering server 100.

Also, the gateway gw may perform one of (i) a process of synchronizing the power data received from at least one specific IoT sensor among the IoT sensors by using the net-increasing counting variable as the synchronization information where the net-increasing counting variable increases whenever the specific IoT sensor transmits the power data, (ii) a process of synchronizing the power data received from the specific IoT sensor by using the time range corresponding to the long-period parameter as the synchronization information, where the long-period parameter is a periodically-reset counting variable, and (iii) a process of synchronizing the power data received from the specific IoT sensor by using both the net-increasing counting variable and the long-period parameter as the synchronization information. And then the gateway gw may perform a process of transmitting the synchronized power data to the metering server 100.

Also, the gateway gw may perform one of (i) a process of synchronizing the power data acquired from at least one specific IoT sensor among the IoT sensors by using the time range corresponding to the long-period parameter as the synchronization information, where the long-period parameter is the value of the RTC (Real Time Clock) embedded in the specific IoT sensor, and (ii) a process of synchronizing the power data acquired from the specific IoT sensor by using the time range corresponding to the long-period parameter as the synchronization information, where part of values of the RTC embedded in the specific IoT sensor is used as the net-increasing counting variable for the long-period parameter. And the gateway gw may transmit the synchronized power data to the metering server 100.

Also, at initial installation of each of the IoT sensors, the gateway gw may perform a process of initializing (i) each starting time of each measurement by each of the IoT sensors and (ii) the synchronization information on each of the IoT sensors, by referring to each broadcast signal from each of the IoT sensors over the network.

Figure 6:
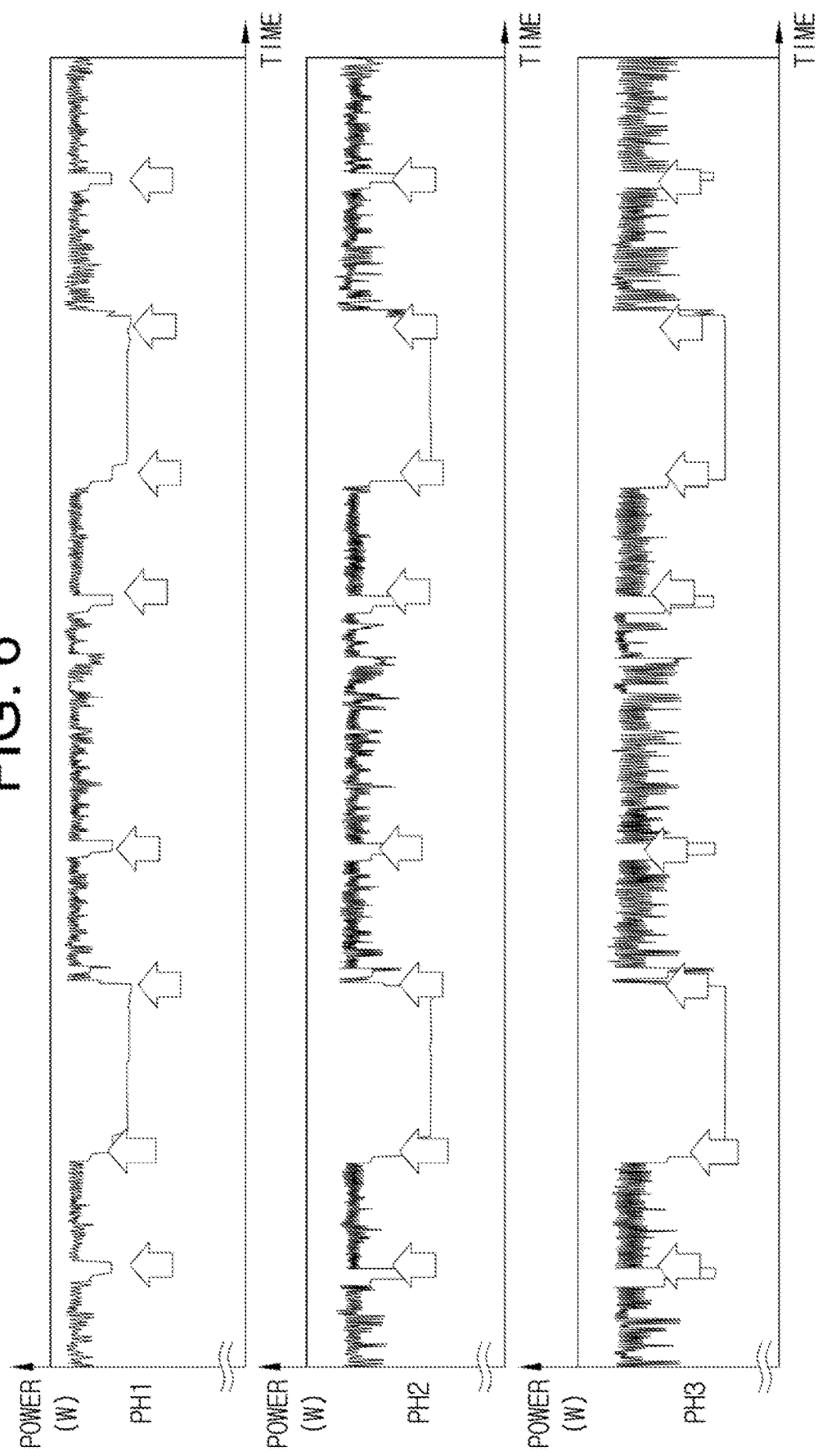
FIG. 6 is a drawing schematically illustrating three-phase power patterns resulting from synchronizing the power data in a power metering system in accordance with one example embodiment of the present disclosure.

And, the metering server 100 may perform (i) a process of acquiring each of power singularities occurring periodically, by analyzing the power data acquired from each of the IoT sensors, and (ii) a process of synchronizing the power data acquired from each of the IoT sensors by using each of the power singularities. As one example, as shown in FIG. 6, if the power data shows three-phase power pattern, pieces of the power data on the three-phase power may be synchronized by using each of points of time of each of the power singularities. Herein, the power pattern changes in each of phases PH1, PH2, and PH3, as a synchronization time.

That is, the metering server 100 may perform one of (i) a process of determining, as the synchronization time, a point of time when at least one statistical value changes, and (ii) a process of determining, as the synchronization time, a point of time when each on/off power fingerprint of each load is acquired. Herein, the statistical value is acquired by analyzing the power data using the power singularities, and each on/off power fingerprint of the each load corresponds to each of the electric devices in the facility.

And, in case each of the IoT sensors transmits the power data, if the power data as shown in FIG. 4, which are detected in real-time, are transmitted, then the size of the transmission data becomes large, and as a result, the transmission speed of the data becomes slow.

Therefore, each of the IoT sensors compresses and transmits the detected power data, to thereby reduce the size of the transmission data and increase the transmission speed of the data over the network.

That is, if a specific event occurs, each of the IoT sensors may perform one of (i) a process of compressing and transmitting one or more power parameters, representing at least one real-time power fluctuation during a period of the specific event, as the power data, and (ii) a process of compressing and transmitting (ii-1) the power parameters corresponding to the real-time power fluctuation during a preset period or (ii-2) one or more pattern codes corresponding to one or more characteristic shapes of at least one power pattern in time series, as the power data.

As one example, each of the IoT sensors may detect the power patterns by using the instantaneous voltage and the instantaneous current, and may compress and transmit event information together with the power information, such as an average of the power, a standard deviation of variation in the power, the voltage, the current, a PF (power factor), an average of periods of changes, a deviation of the periods, etc. which are the power parameters representing statistical characteristics of power fluctuation, acquired from the detected power patterns.

That is, as shown in (a) of FIG. 7, each of the IoT sensors may transmit the data packets of the power data including an average of the measurement values, a standard deviation of the measurement values, one or more starting points of one or more events, one or more event codes (or one or more event shapes), and event shape data, or may compress and transmit them as compressed measurement values as shown in (b) of FIG. 7.

As a result, the metering server 100 may acquire real-time power pattern information using the acquired event information on the events at the points of time of the power fluctuation, and may perform a process of metering the power, a process of measuring the electricity quality, a process of monitoring the power consumption, etc. using the real-time power pattern information.

Also, each of the IoT sensors may perform a process of compressing and transmitting (i) the power parameters corresponding to the real-time power fluctuation during a preset transmission period or (ii) the pattern codes corresponding to the characteristic shapes of the power pattern in time series, as the power consumption data.

That is, as another example other than compressing and transmitting the parameters representative of the power fluctuation at the points of time the events occur as shown in FIG. 7, the parameters representative of the power fluctuation during the preset transmission period may be compressed and transmitted. Especially, the pattern codes may be acquired by encoding one or more specific power patterns occurring in response to the operation of the specific electric device. As one example, the pattern codes may include at least one code corresponding to an on/off state unique to the electric device, which occurs when the electric device is turned on/off, according to the characteristic of the electric device.

And, the power data may include at least part of voltage information, current information, power information, energy information, harmonics information, flicker information, imbalance information, and main signaling information.

Also, the voltage information may include Vrms, Vpk, voltage crest factor (CF), $Vrms^{1/2}$, Vfund, etc., and the current information may include Amps, Apk, A crest factor, $Amps^{1/2}$, Afund, etc., and the power information may include Watts, PF (power factor), etc., the energy information may include kWh, energy loss, etc., the harmonics information may include harmonic order, inter-harmonic order, volts, Amps, Watts, phase angle, etc., the flicker information may include Plt, Pst (1 min), Pinst, etc., the imbalance information may include Volts, Amps, etc., and the main signaling information may include threshold levels, signaling frequency, relative V %, absolute V3s (3 sec avg.), etc.

And, on condition that metering of the power, metering of the electric energy, measuring of the electricity quality, and monitoring of the power consumption of the electric devices are being performed by using the power data acquired from each of the IoT sensors installed on each of the inlet lines of each of the distribution boards as such, a method for detecting a wiring error of the IoT sensors and calibrating the metered values are described as follows.

Installation errors of the IoT sensors may be installation errors in a PT (potential transformer) for voltage measurement and a CT (current transformer) for current measurement.

Therefore, in the single-phase wiring type as shown in (a) of FIG. 3, signs of measured W values may be inverted due to discordance in directions of the PT (potential transformer) for voltage measurement and the CT (current transformer) for current measurement, and the measured values may be calibrated by using an equation 1 as follows.

$$P(t) = Mc \times v(t) \times i(t) \qquad \langle \text{Equation 1} \rangle$$

In the above equation 1, v is a voltage sample, i is a current sample, and Mc is a calibration constant including a sign.

Herein, the measurement values of the IoT sensors may be calibrated using the equation 1 and then transmitted, or the metering server 100 may calibrate the measurement values acquired from the IoT sensors using the equation 1, to thereby meter the power.

And, in the three-phase wiring type as shown in (b), (c), and (d) of FIG. 3, mis-wiring matrices Mi and Mv corresponding to each of the wiring types may be used for calibration.

That is, supposing that an actual measured power is W and that a mis-measured power is W*, then a vector equation between W and W* may be represented as follows.

That is, the actual power may be $W = Vi \times Ii$ and the mis-measured power may be $W^* = Vi^* Ii^*$.

And, $Vi^* = Mv \times Vi$ and $Ii^* = Mi \times Ii$. Herein, Mv may be a mis-wiring PT matrix, and Mi may be a mis-wiring CT matrix.

Therefore, a relation between W and W* may be represented as an equation 2 below.

$$W = Vi \times Ii = \frac{Vi*}{Mv} \times \frac{Ii*}{Mi} = \frac{W*}{Mv \times Mi} \qquad \langle \text{Equation 2} \rangle$$

And, to calculate Mv and Mi in the equation 2, conditions which must be satisfied at the typical measurement in the three-phase power may be used.

As one example, a condition that the power consumption at each of phases L1, L2, and L3 during a power supply period, e.g., 50 Hz or 60 Hz, has a plus sign (minus in case of a plant), and a condition that PT phases of each of the phases L1, L2, and L3 are phase-lead or phase-lag by 120 degrees among one another, may be used to determine the mis-wiring matrices Mv and Mi. Also, a current preservation law (Kirchhoff's circuit law), a closed loop voltage law (an energy law), etc. may be used.

Also, the IoT sensors installed in the facility may have deviation in metered values from previously installed measurement devices due to different installation conditions, deterioration from extended use, an error in initial installation, etc.

To calibrate this, the metering server 100 may calibrate the metered values by using calibration coefficients per gateway and calibration coefficients per IoT sensors.

That is, each of the calibration coefficients c may be applied as $$vc = \frac{vi}{vo}, ic = \frac{ii}{io}, Vc = \frac{Vi}{Vo}, Ic = \frac{Ii}{Io}, Pc = \frac{Pi}{Po}, Sc = \frac{Si}{So},$$

-continued $$\text{and } Qc = \frac{Qi}{Qo}.$$

Herein, v may be the voltage sample, i may be the current sample, V may be rms voltage, I may be rms current, P may be power watt, S may be apparent power VA, and Q may be reactive power var.

As another example other than using the calibration coefficients as above, the metering server 100 may calibrate each of the measurement values of at least one phase of a single-phase type or a multi-phase type among the measurement values thereof, by using total power.

That is, the metering server 100 may calibrate each of the measurement values of the IoT sensors, with the single-phase type or the multi-phase type, of a same ancestor in the hierarchy, by using each value of each of the phases measured at each of the IoT sensors. As one example, if three-phase balanced power is measured differently as shown in FIG. 6, then the power at each phase may be calibrated by using the total power.

Also, the measurement values may be calibrated by using standard measured values acquired via a standard measuring device. As one example, the measurement values of the electrical physical quantity may be calibrated, by using the standard measured values acquired via the standard measuring device provided by a power provider.

In this manner, the metering server 100 may meter the electric physical quantities such as the voltage, the current, the frequency, the power factor, a voltage/current unbalanced neutral current, active/reactive/apparent power maximum/minimum values, active/reactive electrical energy, apparent electrical energy, electrical energy measurement accuracy, and integrated electrical energy, etc.

Also, the metering server 100 may meter the electric physical quantities such as sag/swell, transient, harmonics THD and TDD, harmonics for each order, K-factor, etc. for analysis of the electricity quality.

In addition to this, the metering server 100 may perform a process of acquiring the power pattern in time series corresponding to the power consumed by the electric devices electrically connected with each of the distribution boards from each of the inlet lines of the distribution boards in the facility, and a process of analyzing the acquired power pattern in time series and monitoring the consumed power for each of the usages and for each of the electric devices.

Figure 8:
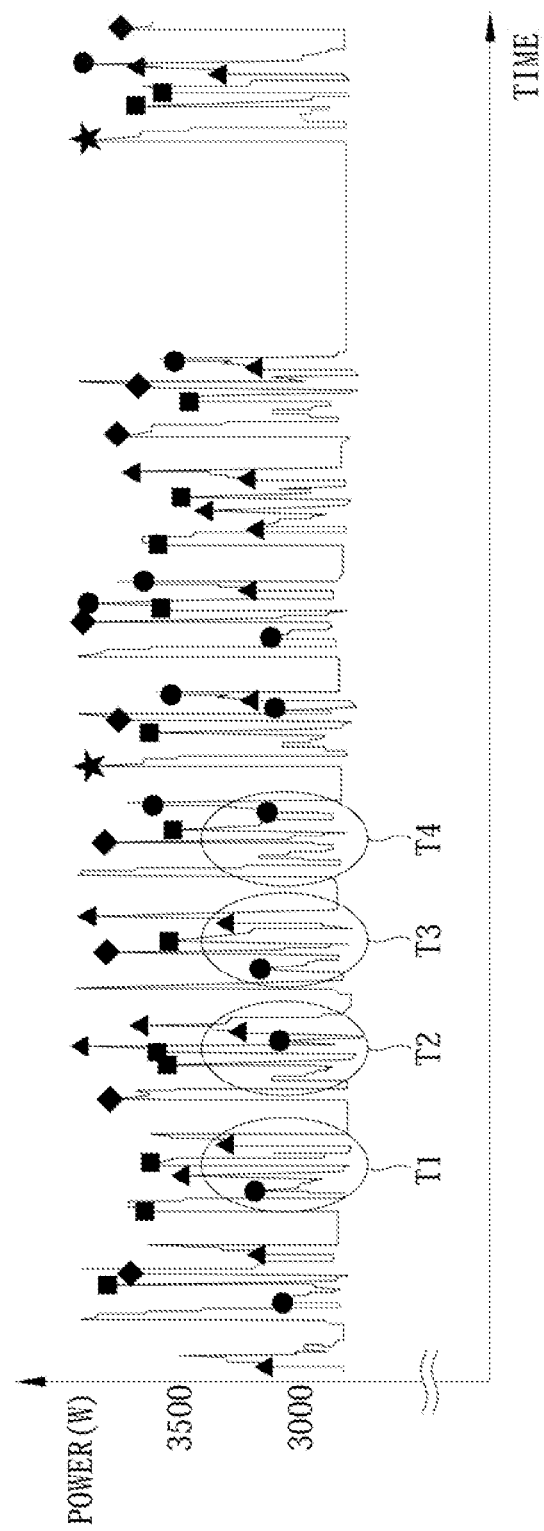
FIGS. 8 and 9 are drawings schematically illustrating a process of analyzing behavior states of one or more loads in the virtual metering system in accordance with one example embodiment of the present disclosure.

That is, the metering server 100 may perform (i) a process of analyzing at least one power pattern in time series as shown in FIG. 8, to thereby detect each of operation states of each of independent loads included in each of the electric devices electrically connected with each of the distribution boards, and (ii) a process of classifying the independent loads, whose operation states have been detected, into groups of subordinate independent loads having dependency based on their own time-behaviors (t1, t2, t3, and t4) based dependency, to thereby map each of the independent loads onto each of the electric devices and monitor the behavior of each of the electric devices.

This process is described in detail by referring to FIG. 9, as follows.

Figure 9:
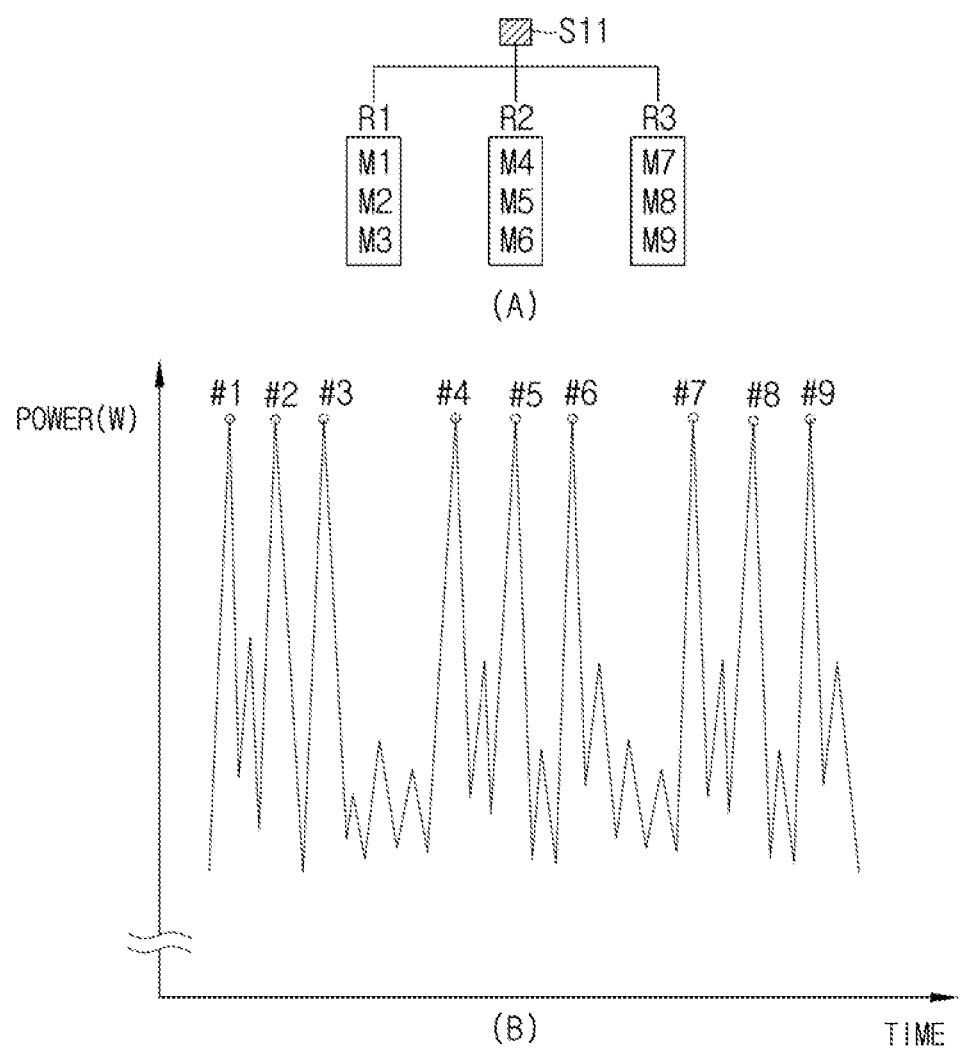

Supposing that, as shown in (a) of FIG. 9, the distribution board, whose inlet line has the IoT sensors S11 installed for detecting the power pattern, is electrically connected with each of the electric devices R1, R2, and R3, and that the electric device R1 has independent loads M1, M2, and M3, the electric device R2 has independent loads M4, M5, and M6, and the electric device R3 has independent loads M7, M8, and M9. As one example, the electric devices may be robots performing processes in a plant, and the independent loads may be motors driving the robots.

Then, each of the electric devices R1, R2, and R3 may repeat specific operation for each predetermined time interval, and the independent loads (M1, M2, M3), (M4, M5, M6), and (M7, M8, M9) respectively located in each of the electric devices R1, R2, and R3 may operate with their own time intervals for repeated operation.

And, the power pattern to be used for detecting their behavior may show patterns repeated with the predetermined time interval as shown in (b) of FIG. 9.

Herein, it is known that each of the independent loads M1, M4, and M7 respectively matches one of patterns #1, #2, and #3, that each of the independent loads M2, M5, and M8 respectively matches one of patterns #4, #5, and #6, and that each of the independent loads M3, M6, and M9 respectively matches one of patterns #7, #8, and 49, however, patterns corresponding to the independent loads M1, M2, and M3 within a single electric device R1 are not exactly known.

Therefore, the metering server 100 may analyze the patterns in (b) of FIG. 9, for example, using Big Data analysis, and determine that patterns #1, #4, and #7 are repeated with their own time intervals, patterns #2, #5, and #8 are repeated with their own time intervals, and patterns #3, #6, and #9 are repeated with their own time intervals.

And, as a result, through the analysis on the power patterns as shown in (b) of FIG. 9, the metering server 100 may perform a process of determining specific subordinate independent loads among all the independent loads as located in the same electric device, wherein the operation states of the specific subordinate independent loads are repeated with a uniform time interval between occurrences and a uniform duration.

That is, through the analysis on the power patterns as shown in (b) of FIG. 9, the metering server 100 may match the power patterns with the independent loads of the electric devices in (a) of FIG. 9 as Table 1 below.

TABLE 1

| electric devices | independent loads | pattern |
|---|---|---|
| R1 | M1 | #1 |
|  | M2 | #4 |
|  | M3 | #7 |
| R2 | M4 | #2 |
|  | M5 | #5 |
|  | M6 | #8 |
| R3 | M7 | #3 |
|  | M8 | #5 |
|  | M9 | #9 |

Figure 10:
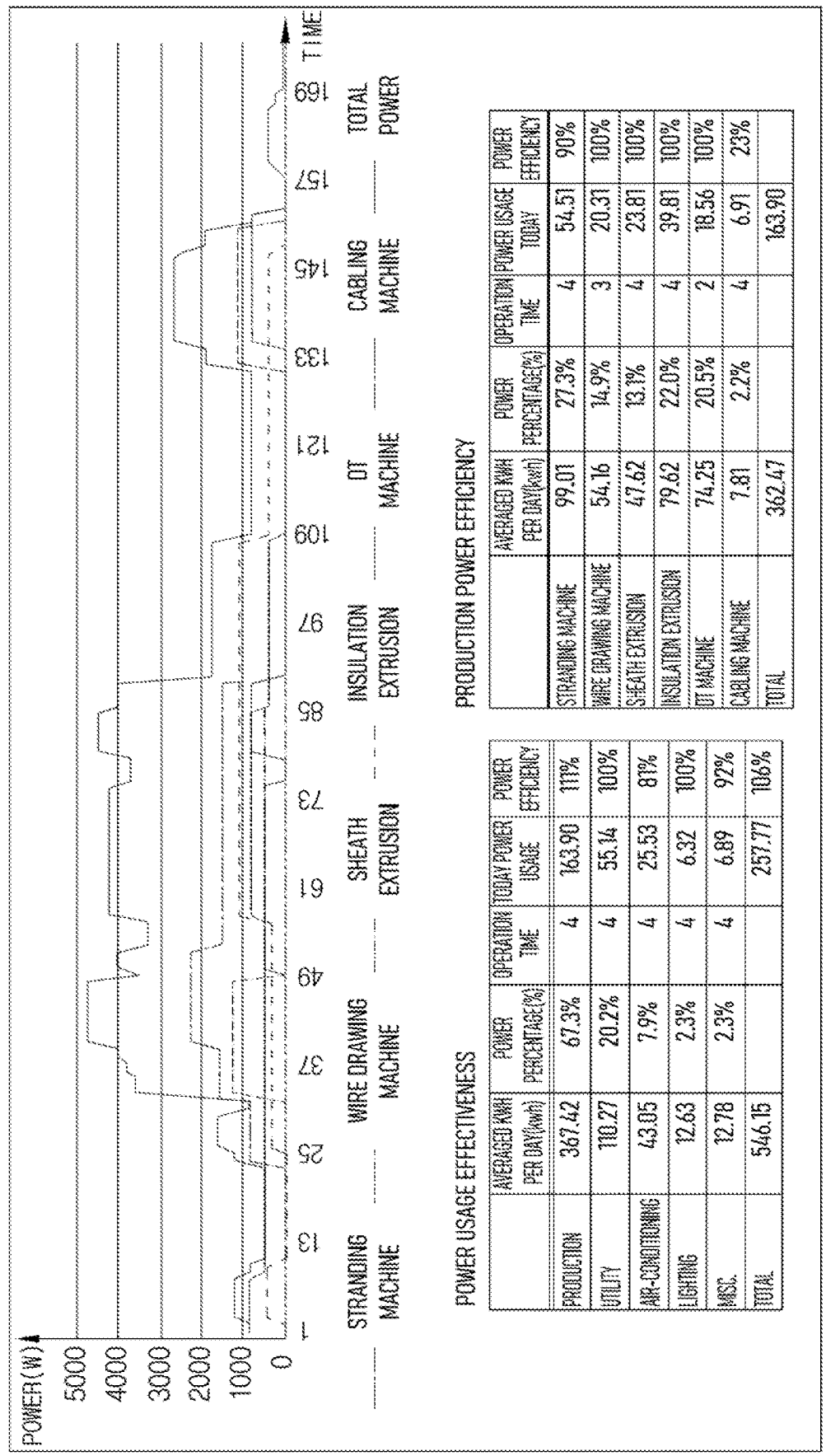
FIG. 10 is a drawing schematically illustrating a process of metering and monitoring power consumption of the facility in the virtual metering system in accordance with one example embodiment of the present disclosure.

And, as shown in FIG. 10, the metering server 100 may (i) analyze the power consumption information on a single distribution board using the method above, (ii) monitor each of the operation states of the electric devices electrically connected with the single distribution board and the operation states of the independent loads of each of the electric devices, and (iii) monitor the power consumption in the facility for each of the usages and for each of the electric devices separately.

Herein, in order to acquire the power pattern in time series corresponding to the power consumed by the electric devices electrically connected with each of the distribution boards from each of the inlet lines of the distribution boards in the facility, one or more IoT sensors capable of detecting information on the power consumption may be installed on each of the inlet lines of the distribution boards.

As one example, as shown in FIGS. 1 and 2, if each of the IoT sensors installed in each of the inlet lines in each of the distribution boards of the facility transmits the power data corresponding to the power consumed by the electric devices electrically connected with each of the distribution boards, the power data transmitted from each of the IoT sensors via at least one gateway over the network may be acquired, and the power data may be analyzed, to thereby allow the power pattern in time series to be acquired.

The present disclosure has an effect of detecting the power consumption information at the distribution boards by using the IoT sensors including the voltage sensors and the current sensors, and configuring a virtual metering system where the metering server therein meters the power, to thereby (i) minimize frequent errors in measuring the electrical energy, the electricity quality, etc. on-site due to incorrect meter installation, and (ii) provide opportunities for calibrating the installation errors remotely.

The present disclosure has another effect of minimizing the installation investment and post-installation operation costs by minimizing the commitment of the electricians required on-site, and easily installing and operating without stopping the operation of the on-site electrical facilities even during the operation of the on-site facilities, to thereby (i) provide real-time analysis of the electricity quality based on Big Data of real-time power and (ii) provide analysis and monitoring of the operation statuses of the on-site facilities in a coming smart factory.

The present disclosure has still another effect of monitoring the behavior of each of the electric devices by metering and analyzing the power supplied from each of the distribution boards to each of the electric devices, to thereby (i) analyze operation statuses of the electric devices in the facility in real-time, (ii) provide additional power-related real-time services by using electricity quality information and information on the behavior, etc. of the electric devices derived from real-time power usage information, and (iii) monitor energy use for each apparatus in a factory analyzed using real-time electrical energy usage pattern in the smart factory, etc.

The embodiments of the present disclosure as explained above may be implemented in a form of executable program command through a variety of computer means recordable to computer readable media. The computer readable media may include solely or in combination, program commands, data files, and data structures. The program commands recorded in the media may be components specially designed for the present disclosure or may be usable to those skilled in the art of computer software. Computer readable media may include magnetic media such as hard disks, floppy disks, and magnetic tapes, optical media such as CD-ROMs and DVDs, magneto-optical media such as floptical disks and hardware devices such as ROM, RAM, and flash memory specially designed to store and carry out program commands. Program commands may include not only a machine language code made by a complier but also a high level code that can be used by an interpreter etc., which may be executed by a computer. The aforementioned hardware device may be configured as one or more software modules to perform the processes of the present disclosure and vice versa.

As seen above, the present disclosure has been explained by specific matters such as detailed components, limited embodiments, and drawings. They have been provided only to help more general understanding of the present disclosure. However, it will be understood by those skilled in the art that various changes and modification may be made from the description without departing from the spirit and scope of the disclosure as defined in the following claims.

Accordingly, the spirit of the present disclosure must not be confined to the explained embodiments, and the following patent claims as well as everything including variations equal or equivalent to the patent claims pertain to the category of the spirit of the present disclosure.

What is claimed is:

1. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and metering, by the metering server, the electrical physical quantity corresponding to total power consumed in the one or more facilities, the metering based on the power data acquired from the plurality of IoT sensors, wherein the metering the electrical physical quantity includes:

identifying a first distribution board of the plurality of distribution boards;

identifying one or more of the plurality of IoT sensors installed on at least one inlet line of the first distribution board, the identifying of the one or more IoT sensors based on measurement points information associated with the one or more IoT sensors; and metering the electrical physical quantity corresponding to the power consumed by the electric devices that are electrically connected with the first distribution board, the metering based on values of the power data acquired from the one or more IoT sensors.

2. The method of claim 1, further comprising:
determining that at least one of the inlet lines is wired a single-phase type;
estimating that a first IoT sensor has a wiring error; and
calibrating a value of the power data associated with the first IoT sensor by using a calibration constant.

3. The method of claim 1, further comprising:
determining that at least one of the inlet lines is wired a multi-phase type;
acquiring a Potential Transformer (PT) matrix and a Current Transformer (CT) matrix as mis-wiring matrices associated with the multi-phase type;
estimating that a first IoT sensor estimated as having has a wiring error; and
calibrating a value of the power data associated with the IoT sensor by using the Potential Transformer (PT) matrix and the Current Transformer (CT) matrix.

4. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and metering, by the metering server, the electrical physical quantity corresponding to total power consumed in the one or more facilities, the metering based on the power data acquired from the plurality of IoT sensors, wherein, the power data acquired from ach of the plurality of IoT sensors include synchronization information, and wherein the metering the electrical physical quantity includes:

synchronizing the power data acquired from the plurality of IoT sensors by referring to the synchronization information.

5. The method of claim 4, wherein the metering server performs a synchronization, and wherein the synchronization comprises at least one of:

synchronizing the power data acquired from one or more of the plurality of IoT sensors by using a net-increasing counting variable as the synchronization information wherein the net-increasing counting variable increases whenever the one or more IoT sensors transmit the power data;

synchronizing the power data acquired from the one or more IoT sensors by using a time range corresponding to a long-period parameter as the synchronization information, wherein the long-period parameter is a periodically-reset counting variable; and synchronizing the power data acquired from the one or more IoT sensors by using both the net-increasing counting variable and the long-period parameter as the synchronization information.

6. The method of claim 5, wherein the long-period parameter is set as the periodically-reset counting variable such that the long-period parameter corresponds to the time range including a period where each of variations in each of loads corresponding to each of the electric devices are reflected.

7. The method of claim 4, wherein the metering server performs a synchronization, and wherein the synchronization comprises at least one of:

synchronizing the power data acquired from one or more of the plurality of IoT sensors by using time range corresponding to a long-period parameter as the synchronization information, wherein the long-period parameter is a value of an RTC (Real Time Clock) embedded in the one or more IoT sensors; and synchronizing the power data acquired from the one or more IoT sensors by using the time range corresponding to the long-period parameter as the synchronization information, wherein part of values of the RTC embedded in the one or more IoT sensors is used as the net-increasing counting variable for the long-period parameter.

8. The method of claim 4, wherein, at initial installation of the plurality of IoT sensors, the metering server (i) initializes each starting time of measurement of the plurality of IoT sensors and (ii) initializes the synchronization information on the plurality of IoT sensors, by referring to broadcast signal from the plurality of IoT sensors over the network.

9. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and metering, by the metering server, the electrical physical quantity corresponding to total power consumed in the one or more facilities, the metering based on the power data acquired from the plurality of IoT sensors, wherein the power data acquired from the plurality of IoT sensors includes synchronization information, and wherein the metering the electrical physical quantity includes:

acquiring synchronized power data in response to the gateway synchronizing and transmitting the power data acquired from the plurality of IoT sensors by referring to the synchronization information.

10. The method of claim 9, wherein the gateway performs a synchronization, and wherein the synchronization comprises at least one of:

synchronizing the power data acquired from one or more of the plurality of IoT sensors by using a net-increasing counting variable as the synchronization information wherein the net-increasing counting variables increase whenever the one or more IoT sensors transmit the power data;

synchronizing the power data acquired from the one or more IoT sensors by using a time range corresponding to a long-period parameter as the synchronization information, wherein the long-period parameter is a periodically-reset counting variable; and synchronizing the power data acquired from the one or more IoT sensors by using both the net-increasing counting variable and the long-period parameter as the synchronization information.

11. The method of claim 9, wherein the gateway performs a synchronization, and wherein the synchronization comprises at least one of:

synchronizing the power data acquired from one or more of the plurality of IoT sensors by using time range corresponding to a long-period parameter as the synchronization information, wherein the long-period parameter is a value of an RTC (Real Time Clock) embedded in the one or more IoT sensors; and synchronizing the power data acquired from the one or more IoT sensors by using the time range corresponding to the long-period parameter as the synchronization information, wherein the long-period parameter includes part of values of the RTC embedded in the one or more IoT sensors to be used for the net-increasing counting variable.

12. The method of claim 9, wherein, at initial installation of the plurality of IoT sensors, the gateway (i) initializes each starting time of measurement of the plurality of IoT sensors and (ii) initializes the synchronization information on the plurality of IoT sensors, by referring to broadcast signal from the plurality of IoT sensors over the network.

13. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the metering server comprises:

a communication part, for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and a processor for metering the electrical physical quantity corresponding to total power consumed in the one or more facilities, the metering based on the power data acquired from the plurality of IoT sensors, wherein the metering the electrical physical quantity includes:

identifying a first distribution board of the plurality of distribution boards;

identifying one or more of the plurality of IoT sensors installed on at least one inlet line of the first distribution board, the identifying of the one or more IoT sensors based on measurement points information associated with the one or more IoT sensors; and metering the electrical physical quantity corresponding to the power consumed by the electric devices that are electrically connected with the first distribution board, the metering based on values of the power data acquired from the one or more IoT sensors.

14. The metering server of claim 13, wherein the metering the electrical physical quantity includes:

determining that at least one of the inlet lines is wired a single-phase type;

estimating that a first IoT sensor has a wiring error; and calibrating a value of the power data associated with the first IoT sensor by using a calibration constant.

15. The metering server of claim 13, wherein the metering the electrical physical quantity includes:

determining that at least one of the inlet lines is wired a multi-phase type;

acquiring a Potential Transformer (PT) matrix and a Current Transformer (CT) matrix as mis-wiring matrices associated with the multi-phase type;

estimating that a first IoT sensor has a wiring error; and calibrating a value of the power data associated with the first IoT sensor by using the Potential Transformer (PT) matrix and the Current Transformer (CT) matrix.

16. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and a processor for metering the electrical physical quantity corresponding to total power consumed in the one or more facilities, the metering based on the power data acquired from the plurality of IoT sensors, wherein the power data acquired from the plurality of IoT sensors include synchronization information, and wherein the metering the electrical physical quantity includes:

synchronizing the power data acquired from the plurality of IoT sensors by referring to the synchronization information.

17. The metering server of claim 16, wherein the processor performs a synchronization, and wherein the synchronization comprises at least one of:

synchronizing the power data acquired from one or more of the plurality of IoT sensors by using a net-increasing counting variable as the synchronization information wherein the net-increasing counting variable increases whenever the one or more IoT sensors transmit the power data;

synchronizing the power data acquired from the one or more IoT sensors by using a time range corresponding to a long-period parameter as the synchronization information, wherein the long-period parameter is a periodically-reset counting variable; and synchronizing the power data acquired from the one or more IoT sensors by using both the net-increasing counting variable and the long-period parameter as the synchronization information.

18. The metering server of claim 17, wherein the long-period parameter is set as the periodically-reset counting variable such that the long-period parameter corresponds to the time range including a period where each of variations in each of loads corresponding to each of the electric devices are reflected.

19. The metering server of claim 16, wherein the processor performs a synchronization, and wherein the synchronization comprises at least one of:

synchronizing the power data acquired from one or more of the plurality of IoT sensors by using time range corresponding to a long-period parameter as the synchronization information, wherein the long-period parameter is a value of an RTC (Real Time Clock) embedded in the one or more IoT sensors; and synchronizing the power data acquired from the one or more IoT sensors by using the time range corresponding to the long-period parameter as the includes part of values of the RTC embedded in the one or more IoT sensors to be used for the net-increasing counting variable.

20. The metering server of claim 16, wherein, at initial installation of the plurality of IoT sensors, the processor (i) initializes each starting time of measurement of the plurality of IoT sensors and (ii) initializes the synchronization information on the plurality of IoT sensors, by referring to ach broadcast signal from the plurality of IoT sensors over the network.

21. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
- a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and
- a processor for metering the electrical physical quantity corresponding to total power consumed in the one or more facilities, the metering based on the power data acquired from the plurality of IoT sensors,
- wherein the power data acquired from the plurality of IoT sensors includes synchronization information, and
- wherein the metering the electrical physical quantity includes:
- the communication part acquiring synchronized power data in response to the gateway synchronizing and transmitting the power data acquired from the plurality of IoT sensors by referring to the synchronization information.

22. The metering server of claim 21, wherein the gateway performs a synchronization, and wherein the synchronization comprises at least one of:
- synchronizing the power data acquired from one or more of the plurality of IoT sensors by using a net-increasing counting variable as the synchronization information wherein the net-increasing counting variables increase whenever the one or more IoT sensors transmit the power data;
- synchronizing the power data acquired from the one or more IoT sensors by using a time range corresponding to a long-period parameter as the synchronization information, wherein the long-period parameter is a periodically-reset counting variable; and
- synchronizing the power data acquired from the one or more IoT sensors by using both the net-increasing counting variable and the long-period parameter as the synchronization information.

23. The metering server of claim 21, wherein the gateway performs a synchronization, and wherein the synchronization comprises at least one of:
- synchronizing the power data acquired from one or more of the plurality of IoT sensors by using time range corresponding to a long-period parameter as the synchronization information, wherein the long-period parameter is a value of an RTC (Real Time Clock) embedded in the one or more IoT sensors; and
- synchronizing the power data acquired from the one or more IoT sensors by using the time range corresponding to the long-period parameter as the synchronization information, wherein the long-period parameter includes part of values of the RTC embedded in the one or more IoT sensors to be used for the net-increasing counting variable.

24. The metering server of claim 21, wherein, at initial installation of the plurality of IoT sensors, the gateway (i) initializes each starting time of measurement by the plurality of IoT sensors and (ii) initializes the synchronization information on the plurality of IoT sensors, by referring to broadcast signal from the plurality of IoT sensors over the network.

25. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
- acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and
- metering, by the metering server, the electrical physical quantity corresponding to total power consumed in the one or more facilities, the metering based on the power data acquired from the plurality of IoT sensors,
- wherein the metering the electrical physical quantity includes:
- acquiring power singularities occurring periodically, by analyzing the power data acquired from the plurality of IoT sensors; and
- synchronizing the power data acquired from the plurality of IoT sensors by using the power singularities.

26. The method of claim 25, wherein the metering server performs a determination of a synchronization time, wherein the determination of the synchronization time comprises at least one of:
- determining, as the synchronization time, a point of time when at least one statistical value changes, wherein the statistical value is acquired by analyzing the power data using the power singularities; and
- determining, as the synchronization time, a point of time when each on/off power fingerprint of each load is acquired, wherein said each on/off power fingerprint corresponds to each of the electric devices in the one or more facilities.

27. A method for metering at least one electrical physical quantity using power data that is associated with a plurality of distribution boards in one or more facilities, the method comprising:
- acquiring, by a metering server, a power pattern time series corresponding to power consumed by one or more electric devices electrically connected with one or more of the plurality of distribution boards; and
- using the power pattern time series, to monitor the power consumed by the one or more electric devices,
- wherein the using the power pattern time series includes:
- analyzing the power pattern time series, to thereby detect operation states of independent loads included in the one or more electric devices electrically connected with the plurality of the distribution boards; and
- classifying the independent loads, whose operation states have been detected, into groups of subordinate independent loads having dependency based on their own time-behaviors, to thereby map each of the independent loads onto the one or more electric devices.

28. The method of claim 27, wherein the metering server determines first subordinate independent loads among the independent loads as located in a same electric device, wherein operation states of the first subordinate independent loads are repeated with a uniform time interval between occurrences and a uniform duration.

29. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
    a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and
    a processor for metering the electrical physical quantity corresponding to total power consumed in the one or more facilities, the metering based on the power data acquired from the plurality of IoT sensors,
    wherein the metering the electrical physical quantity includes:
    acquiring power singularities occurring periodically, by analyzing the power data acquired from the plurality of IoT sensors; and
    synchronizing the power data acquired from the plurality of IoT sensors by using the power singularities.

30. The metering server of claim 29, wherein the processor performs a determination of a synchronization time, wherein the determination of the synchronization time comprises at least one of:
    determining a point of time, when at least one statistical value changes which is acquired by analyzing the power data using the power singularities, as the synchronization time; and
    determining a point of time, when each on/off power fingerprint of each load corresponding to each of the electric devices in the one or more facilities is acquired, as the synchronization time.

31. A metering server for metering at least one electrical physical quantity using power data that is associated with a plurality of distribution boards in one or more facilities, the metering server comprising:
    a communication part for acquiring a power pattern time series corresponding to power consumed by one or more electric devices electrically connected with one or more of the plurality of distribution boards; and
    a processor for using the power pattern time series, to monitor the power consumed by the one or more electric devices,
    wherein the using the power pattern time series includes:
    analyzing the power pattern time series, to thereby detect operation states of independent loads included in the one or more electric devices electrically connected with the plurality of the distribution boards; and
    classifying the independent loads, whose operation states have been detected, into groups of subordinate independent loads having dependency based on their own time-behaviors, to thereby map each of the independent loads onto the one or more electric devices.

32. The metering server of claim 31, wherein the processor determines first subordinate independent loads among the independent loads as located in a same electric device, wherein operation states of the first subordinate independent loads are repeated with a uniform time interval between occurrences and a uniform duration.

33. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
    acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and
    metering, by the metering server, the electrical physical quantity corresponding to total power consumed in the one or more facilities, the metering based on the power data acquired from the plurality of IoT sensors,
    wherein the power data is acquired during a transmission period and comprises power consumption information collected during a sampling period.

34. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
    acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and
    metering, by the metering server, the electrical physical quantity corresponding to total power consumed in the one or more facilities, the metering based on the power data acquired from the plurality of IoT sensors,
    wherein, if a specific event occurs, the metering server acquires one of (i) one or more power parameters, representing at least one real-time power fluctuation during a period of the specific event, as the power data, from the plurality of IoT sensors, and (ii) (ii-1) the power parameters corresponding to the real-time power fluctuation during a preset period or (ii-2) one or more pattern codes corresponding to one or more characteristic shapes of at least one power pattern in time series, as the power data, from the plurality of IoT sensors.

35. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
    acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and
    metering, by the metering server, the electrical physical quantity corresponding to total power consumed in the one or more facilities, the metering based on the power data acquired from the plurality of IoT sensors,
    wherein the power data includes at least part of voltage information, current information, power information, energy information, harmonics information, flicker information, imbalance information, and main signaling information.

36. A method for metering at least one electrical physical quantity using a plurality of Internet of Things (IoT) sensors and a metering server, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

acquiring from the plurality of IoT sensors, by the metering server, power data corresponding to power consumed by one or more electric devices electrically connected with one or more of the plurality of distribution boards, wherein the power data are transmitted by the plurality of IoT sensors via at least one gateway over a network; and metering, by the metering server, the electrical physical quantity corresponding to total power consumed in the one or more facilities, the metering based on the power data acquired from the plurality of IoT sensors, wherein the metering server performs a calibration, and wherein the calibration comprises at least one of:

calibrating the electrical physical quantity using one or more calibration coefficients associated with the at least one gateway and one or more calibration coefficients associated with the IoT sensors;

calibrating, based on total power, one or more measurements of the electrical physical quantity for at least one phase of an inlet line wiring; and calibrating the electrical physical quantity based on one or more measurements of the electrical physical quantity.

37. A method for metering at least one electrical physical quantity using power data that is associated with a plurality of distribution boards in one or more facilities, the method comprising:

acquiring, by a metering server, a power pattern time series corresponding to power consumed by one or more electric devices electrically connected with one or more of the plurality of distribution boards; and using the power pattern time series, to monitor the power consumed by the one or more electric devices, wherein, if a plurality of IoT sensors installed in a respective inlet line of a plurality of inlet lines associated with a respective distribution board of the plurality of distribution boards transmits the power data corresponding to the power consumed by the electric devices, the metering server acquires the power data transmitted from the plurality of IoT sensors via at least one gateway over a network, and analyzes the power data, to thereby acquire the power pattern time series.

38. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and a processor for metering the electrical physical quantity corresponding to total power consumed in the one or more facilities, the metering based on the power data acquired from the plurality of IoT sensors, wherein the power data is acquired by the communication part during a transmission period and comprises power consumption information collected during a sampling period.

39. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and a processor for metering the electrical physical quantity corresponding to total power consumed in the one or more facilities, the metering based on the power data acquired from the plurality of IoT sensors, wherein, if a specific event occurs, the communication part acquires one of (i) one or more power parameters, representing at least one real-time power fluctuation during a period of the specific event, as the power data, from the plurality of IoT sensors, and (ii) (ii-1) the power parameters corresponding to the real-time power fluctuation during a preset period or (ii-2) one or more pattern codes corresponding to one or more characteristic shapes of at least one power pattern in time series, as the power data, from the plurality of IoT sensors.

40. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:

a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and a processor for metering the electrical physical quantity corresponding to total power consumed in the one or more facilities, the metering based on the power data acquired from the plurality of IoT sensors, wherein the power data includes at least part of voltage information, current information, power information, energy information, harmonics information, flicker information, imbalance information, and main signaling information.

41. A metering server for metering at least one electrical physical quantity using a plurality of Internet of Things (IoT) sensors, wherein each of the plurality of IoT sensors is installed in a respective inlet line of a plurality of inlet lines, and wherein each of the plurality of inlet lines is associated with a respective distribution board of a plurality of distribution boards in one or more facilities, and wherein the method comprises:
- a communication part for acquiring from the plurality of IoT sensors, power data corresponding to power consumed by one or more electric devices electrically connected with one or more of the plurality of distribution boards, wherein the power data are transmitted by the plurality of IoT sensors via at least one gateway over a network; and
- a processor for metering the electrical physical quantity corresponding to total power consumed in the one or more facilities, the metering based on the power data acquired from the plurality of IoT sensors, wherein the processor performs a calibration, and wherein the calibration comprises at least one of:

calibrating the electrical physical quantity using one or more calibration coefficients associated with the at least one gateway and one or more calibration coefficients associated with the IoT sensors;

calibrating, based on total power, one or more measurements of the electrical physical quantity for at least one phase of an inlet line wiring; and calibrating the electrical physical quantity based on one or more measurements of the electrical physical quantity.

42. A metering server for metering at least associated with a plurality of distribution boards in one or more facilities, the metering server comprising:
- a communication part for acquiring a power pattern time series corresponding to power consumed by one or more electric devices electrically connected with one or more of the plurality of distribution boards; and
- a processor for using the power pattern time series, to monitor the power consumed by the one or more electric devices,
wherein, if a plurality of IoT sensors installed in a respective inlet line of a plurality of inlet lines associated with a respective distribution board of the plurality of distribution boards transmits the power data corresponding to the power consumed by the electric devices, the processor acquires the power data transmitted from the plurality of IoT sensors via at least one gateway over a network, and analyzes the power data, to thereby acquire the power pattern time series.

* * * * *